(12) United States Patent
McLaughlin et al.

(10) Patent No.: US 8,677,224 B2
(45) Date of Patent: Mar. 18, 2014

(54) CONVOLUTIONAL CODE FOR USE IN A COMMUNICATION SYSTEM

(75) Inventors: Michael McLaughlin, Dublin (IE); Billy Verso, Maynooth (IE)

(73) Assignee: DecaWave Ltd., Dublin (IE)

( * ) Notice: Subject to any disclaimer, the term of this patent is extended or adjusted under 35 U.S.C. 154(b) by 137 days.

(21) Appl. No.: 13/092,146

(22) Filed: Apr. 21, 2011

(65) Prior Publication Data

US 2011/0264988 A1      Oct. 27, 2011

Related U.S. Application Data

(60) Provisional application No. 61/332,126, filed on May 6, 2010, provisional application No. 61/327,769, filed on Apr. 26, 2010, provisional application No. 61/326,282, filed on Apr. 21, 2010.

(51) Int. Cl.
*H03M 13/03*      (2006.01)

(52) U.S. Cl.
USPC .......................................................... 714/786

(58) Field of Classification Search
None
See application file for complete search history.

(56) References Cited

U.S. PATENT DOCUMENTS

| | | | | |
|---|---|---|---|---|
| 3,891,959 A * | 6/1975 | Tsuji et al. | ..................... | 714/786 |
| 4,404,674 A * | 9/1983 | Rhodes | ........................ | 714/793 |
| 5,115,438 A * | 5/1992 | Friederichs et al. | .......... | 714/793 |
| 5,499,246 A * | 3/1996 | Cooper | ........................ | 370/345 |
| 6,023,783 A * | 2/2000 | Divsalar et al. | ................ | 714/792 |
| 6,415,005 B2 * | 7/2002 | Koga et al. | .................... | 375/347 |
| 2001/0001617 A1 * | 5/2001 | Koga et al. | .................... | 375/347 |
| 2002/0147954 A1 * | 10/2002 | Shea | ............................ | 714/755 |
| 2003/0126545 A1 * | 7/2003 | Tan | ............................... | 714/786 |
| 2003/0185181 A1 * | 10/2003 | Balachandran et al. | ...... | 370/337 |
| 2004/0072572 A1 * | 4/2004 | Nakamura et al. | ........... | 455/450 |
| 2004/0179517 A1 * | 9/2004 | Yamamoto et al. | .......... | 370/356 |
| 2007/0041458 A1 * | 2/2007 | Hocevar et al. | .............. | 375/260 |

* cited by examiner

*Primary Examiner* — Guerrier Merant
(74) *Attorney, Agent, or Firm* — Jeffrey Van Myers; Artie A. Pennington (57) ABSTRACT

In a communication system, a transmitter receives an input bit, and in response thereto, generates at least an n-bit codeword, each bit of which is generated by a respective one of n generators of which m are exactly the same, m being greater than n/2. A receiver comprises: m detectors, each adapted to receive the bit generated by a respective one of the m generators, and provide a respective one of m partial detection signals if a strength of the received bit exceeds a predetermined minimum threshold; and a majority logic element adapted to receive each of the m partial detection signals, and provide an output bit indicative of the input bit only if more than m/2 of the received m partial detection signals exceeds the minimum threshold.

15 Claims, 5 Drawing Sheets

10

12   14            18   16

Transmitter            20            Receiver

Rate ¼ convolutional coder

12d

Transmitter

Fig. 11

| Preamble | SFD | PHR |
|---|---|---|
| Up to 96 pulses (TBD) | 0001 0011 0101 1110 | 22 bits |

Fig. 12

Have swapped these around

| Encoding Type | Frame Length | LEI Type | Header Extension | SECDED bits |
|---|---|---|---|---|
| 3 bits | 7 bits | 5 bits | 1 bit | 6 bits |

Fig. 13

CONVOLUTIONAL CODE FOR USE IN A COMMUNICATION SYSTEM

CROSS-REFERENCE TO RELATED APPLICATIONS

This application claims priority to U.S. Provisional Patent Applications Ser. No. 61/332,126, filed 6 May 2010, Ser. No. 61/327,769, filed 26 Apr. 2010, and Ser. No. 61/326,282, filed 21 Apr. 2010 ("Parent Provisional(s)"). The forgoing Parent Provisional is hereby incorporated by reference in its entirety as if fully set forth herein.

BACKGROUND OF THE INVENTION

1. Field of the Invention

The present invention relates generally to ultra-wideband communication systems, and, in particular, to a convolutional code for use in a communication system.

2. Description of the Related Art

In general, in the descriptions that follow, we will italicize the first occurrence of each special term of art, which should be familiar to those skilled in the art of ultra-wideband ("UWB") communication systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well know, consistent system operation can be obtained by reversing the logic sense of all such signals, such that signals described herein as logically true become logically false and vice versa. Furthermore, it is of no relevance in such systems which specific voltage levels are selected to represent each of the logic states.

Generally, in an ultra-wideband ("UWB") communication system, a series of special processing steps are performed by a UWB transmitter to prepare payload data for transmission via a packet-based UWB channel. Upon reception, a corresponding series of reversing steps are performed by a UWB receiver to recover the data payload. Details of both series of processing steps are fully described in *IEEE Standards* 802.15.4 ("802.15.4"), 802.15.4*a* ("802.15.4*a*"), and 802.15.4*f* ("802.15.4*f*") copies of which are submitted herewith and which are expressly incorporated herein in their entirety by reference. As is known, these Standards describe required functions of both the transmit and receive portions of the system, but specific implementation details only of the transmit portion of the system, leaving to implementers the choice of how to implement the receive portion.

One of us, Michael McLaughlin, has developed certain improvements for use in UWB communication systems, which improvements are fully described in the following pending applications or issued patents, all of which are expressly incorporated herein in their entirety:

"A Method and Apparatus for Generating Codewords", U.S. Pat. No. 7,787,544, issued 31 Jul. 2010 ("Related Patent #1");

"A Method and Apparatus for Generating Codewords", application Ser. No. 11/309,222, filed 13 Jul. 2006, now abandoned ("Related Application #1");

"A Method and Apparatus for Transmitting and Receiving Convolutionally Coded Data", U.S. Pat. No. 7,636,397, issued 22 Dec. 2009 ("Related Patent #1"); and "A Method and Apparatus for Transmitting and Receiving Convolutionally Coded Data", application Ser. No. 12/590,124, filed 3 Nov. 2009 ("Related Application #2").

Some of us have participated in the development of certain improvements in a receiver for use in UWB communication systems, which improvements are fully described in the following pending applications, all of which are expressly incorporated herein in their entirety:

"A Receiver for Use in an Ultra-Wideband Communication System", application Ser. No. 12/885,517, filed 19 Sep. 2010 ("Related Application #3").

"An Adaptive Ternary A/D Converter for Use in an Ultra-Wideband Communication System", application Ser. No. 13/033,098, filed 23 Feb. 2011 ("Related Application #4").

As described in U.S. Pat. No. 7,636,397 and Related Application #2, the coded bits of a convolutional code are often transmitted using Binary Phase Shift Keying ("BPSK"). The coded bits of a convolutional code may also be transmitted using On-Off Keying ("OOK"). In OOK modulation, digital data may, for example, be represented as a logic one level if a carrier wave is present and represented as a logic zero level if a carrier wave is not present. The data is typically examined over a pre-determined period of time.

As is known, a Viterbi decoder may be included in the receiver of the system. Depending on the complexity of the Viterbi decoder, received channel symbols may be quantized to one bit of precision ("hard decision") or more than one bit of precision ("soft decision"). As is known, a Viterbi decoder that uses a soft decision algorithm typically performs better than a Viterbi decoder that uses a hard decision algorithm.

We submit that what is needed is an improved method and apparatus for transmitting and receiving convolutional code for use in a communication system. For example, the communication system may operate as described in 802.15.4f. In particular, we submit that such a method and apparatus should provide performance generally comparable to the best prior art techniques while requiring less circuitry and consuming less power than known implementations of such prior art techniques.

BRIEF SUMMARY OF THE INVENTION

In accordance with one embodiment of our invention, we provide a communication system comprising: a transmitter adapted to receive an input bit, and in response thereto, generate at least an n-bit codeword, each bit of which is generated by a respective one of n generators of which m are exactly the same, m being greater than n/2; and a receiver comprising m detectors, each adapted to receive the bit generated by a respective one of the m generators, and provide a respective one of m partial detection signals if a strength of the received bit exceeds a predetermined minimum threshold; and a majority logic element adapted to receive each of the m partial detection signals, and provide an output bit indicative of the input bit only if more than m/2 of the received m partial detection signals exceeds the minimum threshold.

In a communication system wherein a transmitter receives an input bit and, in response thereto, generates at least an n-bit codeword, each bit of which is generated by a respective one of n generators of which m are exactly the same, m being greater than n/2, we provide, in accordance with another embodiment of our invention, a receiver comprising: m detectors, each adapted to receive the bit generated by a respective one of the m generators, and provide a respective one of m partial detection signals if a strength of the received bit exceeds a predetermined minimum threshold; and a majority logic element adapted to receive each of the m partial detection signals, and, provide an output bit indicative of the input bit only if more than m/2 of the received m partial detection signals exceeds the minimum threshold.

In accordance with yet another embodiment of our invention, we provide a transmitter adapted to receive an input bit, and in response thereto, generate at least an n-bit codeword using a convolutional code having less than optimal free distance, $d_{free}$, each bit of which is generated by a respective one of n generators of which m are exactly the same, m being greater than n/2.

BRIEF DESCRIPTION OF THE SEVERAL VIEWS OF THE DRAWINGS

Our invention may be more fully understood by a description of certain preferred embodiments in conjunction with the attached drawings in which.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Figure 1:
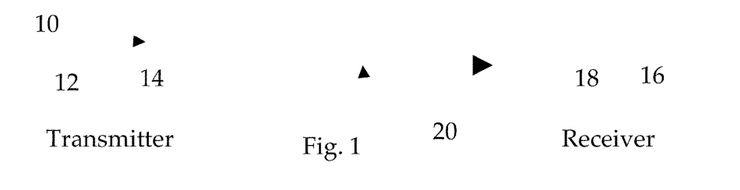
FIG. 1 illustrates, in block diagram form, a communication system constructed in accordance with one embodiment of our invention.

Shown in FIG. 1 is a communication system 10 constructed in accordance with our invention. In general, communication system 10 comprises a transmitter 12 having a transmitting antenna 14, and a receiver 16 having a receiving antenna 18. During normal operation, transmitter 12 transmits a signal to receiver 16 via antennas 14 and 18, as generally indicated by dashed line 20. In one embodiment of our invention, transmitter 12 and receiver 16 operate using ultra-wide-band technologies as explained hereinafter (see, also, the Related Patents and Related Applications). In accordance with our invention, transmitter 12 is adapted to receive each of a plurality of input bits, and in response to receiving each such bit, to generate a respective codeword comprising at least n-bits, each bit of which is generated by a respective one of n generators of which m are exactly the same, m being greater than n/2. As is known, the bits comprising each codeword are generated in parallel, but thereafter serialized for transmission; upon reception, the serially-received bits are reconverted into parallel form for recovery of the corresponding original input bit. In accordance with our invention, receiver 16 receives all of the transmitted code bits comprising the codeword, then attempts to develop a single output bit corresponding to the original bit input into the transmitter as a function of the logic states of a majority of the m duplicative bits of the codeword; the non-duplicative bit is not used by the majority logic. In the event that a majority of the received m duplicative bits are not determined to be of like logical state, the codeword for the bit is deemed to be in error. In a packet-based communication system, a single codeword error may result in rejection of the entire packet, thereby requiring retransmission of the packet until received without codeword errors.

Figure 2:
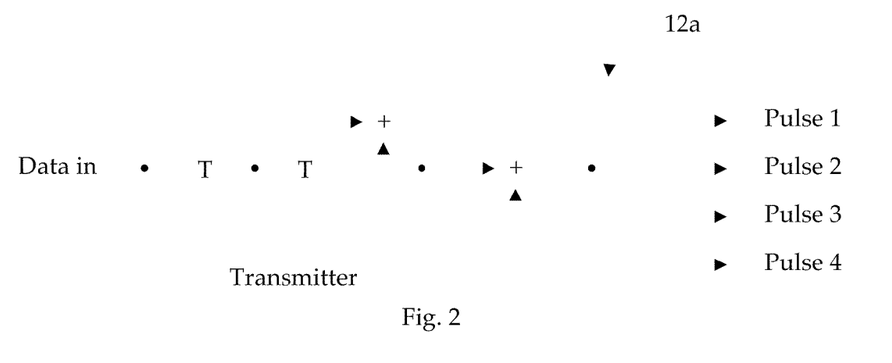
FIG. 2 illustrates, in block diagram form, a transmitter portion of a communication system, using a rate 1/4 convolutional code, constructed in accordance with one embodiment of our invention.

Shown in FIG. 2 is a transmitter 12a constructed in accordance with one embodiment of our invention. In particular, transmitter 12a is specially adapted to receive a data input bit, and in response thereto, to generate a 4-bit codeword, each bit of which is generated by a respective one of 4 generators of which 3 are exactly the same. As is known, this form of codeword generator may be characterized as an octal code generator of form 5,7,7,7, corresponding respectively to pulses 4,3,2,1.

Figure 3:
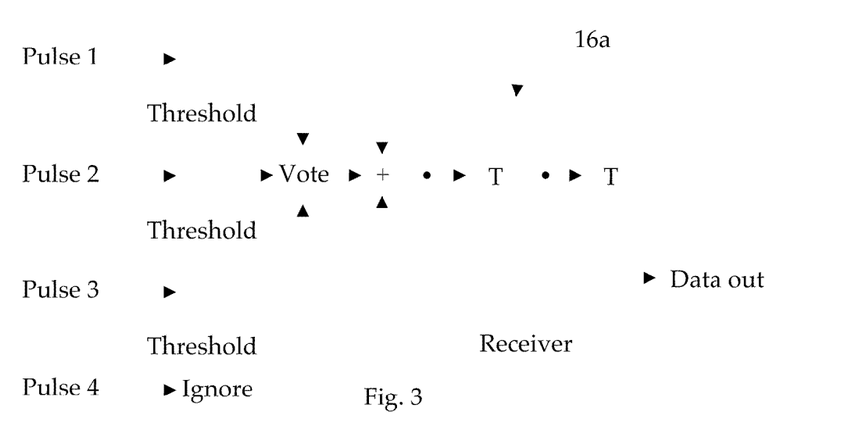
FIG. 3 illustrates, in block diagram form, a receiver portion of a communication system, using a pre-voting threshold majority logic, constructed in accordance with one embodiment of our invention.

Shown in FIG. 3 is a receiver 16a constructed in accordance with one embodiment of our invention. In particular, receiver 16a is adapted first to receive each of the 3 duplicative code bits output by transmitter 12a, and to develop a respective logic state for each of the duplication code bits as a function of a predetermined quality threshold. A vote multiplexer selects each logic state in turn for input to a majority logic circuit. After all 3 of the duplicative code bits have been received and processed, the majority logic circuit counts the number of code bits determined to be of like logic state. If the count is at least 2, being a majority of 3, the majority logic circuit will output a data bit corresponding to the corresponding input bit. Otherwise, majority logic circuit will output a fault signal indicating that the codeword was determined to be in error.

Figure 4:
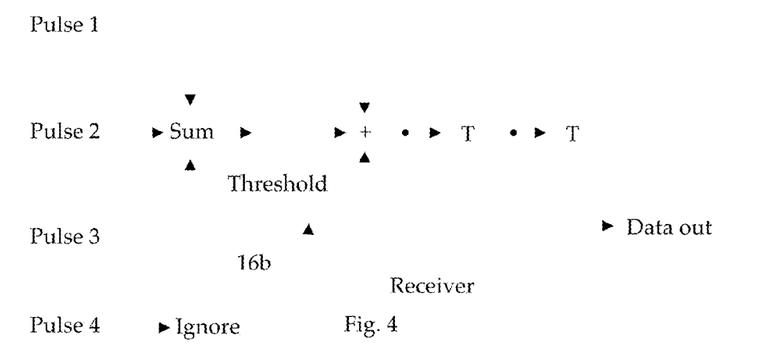
FIG. 4 illustrates, in block diagram form, a receiver portion of a communication system using a post-voting threshold majority logic, constructed in accordance with an alternate embodiment of our invention.

Shown in FIG. 4 is a receiver 16b constructed in accordance with another embodiment of our invention. In particular, in receiver 16b the vote multiplexor ("sum") selects each of the raw code bits in turn, and thereafter develops the respective logic state using a single, share quality threshold circuit.

Figure 5:
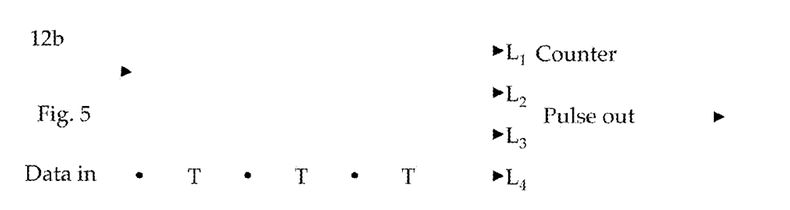
FIG. 5 illustrates, in block diagram form, a pulse position transmitter portion of a communication system, constructed in accordance with another embodiment of our invention.

Shown in FIG. 5 is a transmitter 12b constructed in accordance with another embodiment of our invention. In this embodiment, transmitter 12b is adapted to encode each subset of n data bits into an n-ary pulse position code frame, wherein each unique configuration of n data bits will result in a single pulse in a respective one of n possible pulse positions comprising the code frame. Such an arrangement reduces pulse density in 3 ways:
1. There will be an average of 1 pulse for 4 bits instead of 2 pulses;
2. Worst case, there will be only 1 pulse for 4 bits instead of 4 pulses; and
3. Pulses are spread out over a period that is 4 times longer, thereby reducing average power density.

Figure 6:
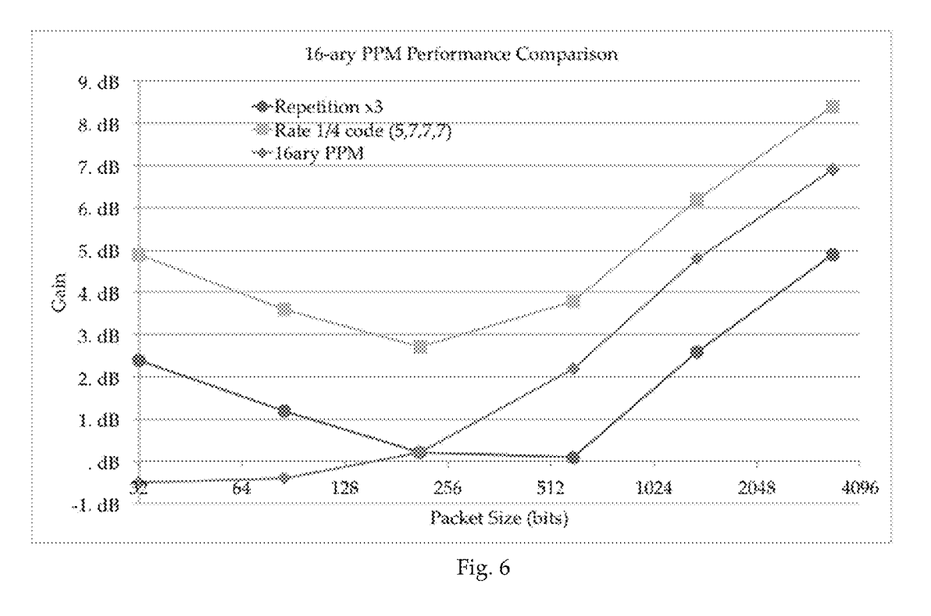
FIG. 6 illustrates a PPM performance comparison of gain vs. packet size (bits) of the pulse position transmitter illustrated in FIG. 5.

By way of example, a worst case of 1 ms of 1000 pulses becomes 4 ms with approximately 63 pulses in each 1 ms portion. This would allow an increase of the Pulse Repetition Frequency ("PRF") to as much as 3 MHz, and still have a peak limited signal. In this embodiment, for a 1 MHz PRF, every 16 µs, the pulse position circuit will output a single 1 µs wide pulse after the count "programmed" by the set of 4 data bits currently being presented on inputs $L_1 \ldots L_4$. It should be noted, however, that there is a small penalty to pay (approximately 0.4 dB) in the receiver (not shown), because for every 4 data input bits, there are 16 ways to make an error instead of 4 ways. FIG. 6 compares the gain of a 16-nary PPM transmitter 10b as a function of packet size.

Figure 7:
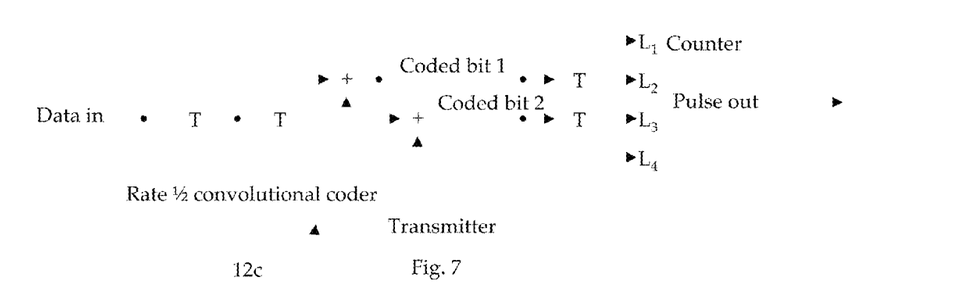
FIG. 7 illustrates, in block diagram form, a pulse position transmitter portion of a communication system, constructed in accordance with yet another embodiment of our invention.

Shown in FIG. 7 is an improved transmitter 12c which augments the pulse position capability of the transmitter 12b with Forward Error Correction ("FEC") support. In this embodiment, input data is coded using a standard K=3, rate ½ convolutional code. The octal generators (5,7) are considered "optimal", as in, e.g., known BPSK systems. In the receiver, the data bits can be recovered using a low complexity Viterbi decoder, e.g., approximately 3.3 k logic gates for a soft decoder implementation. In the illustrated embodiment, the free distance, $d_{free}$ is 6, and asymptotic gain is 7.8 dB; actual gain is 5.8 dB at $10^{-4}$ Bit Error Rate ("BER") (recall that we lose 1.6 dB for $10^{-4}$ BER+0.4 dB as noted above). Alternatively, we could use a higher constraint length, K:
K=4=>dfree=9=>9 dB asymptotic gain;
K=5=>dfree=10=>10 dB asymptotic gain;
K=6=>dfree=12=>10.8 dB asymptotic gain; or
K=7=>dfree=14=>11.5 dB asymptotic gain.
However, each increment of K approximately doubles the complexity of the Viterbi decoder.

Figure 8:
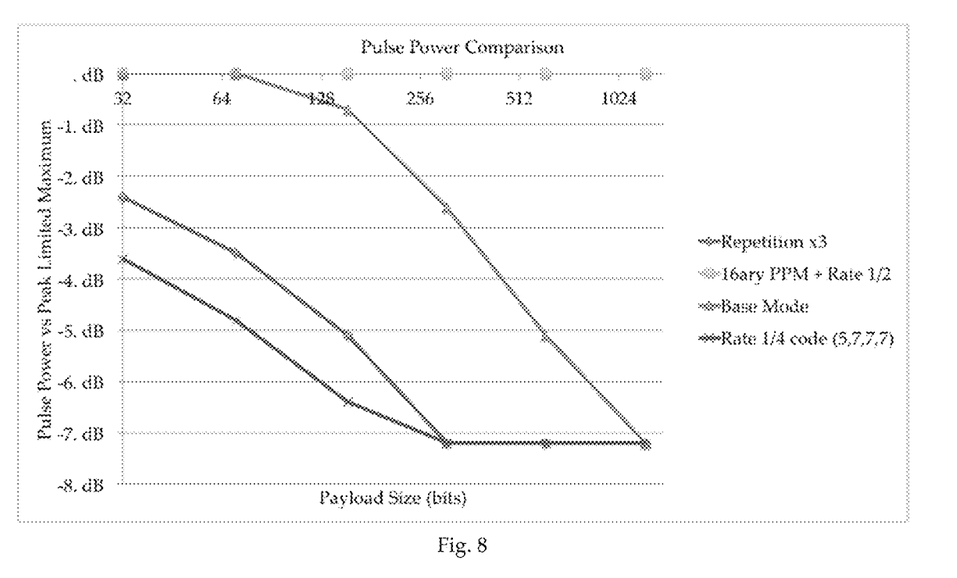
FIG. 8 illustrates a pulse power comparison of the pulse position transmitter illustrated in FIG. 7.
Figure 9:
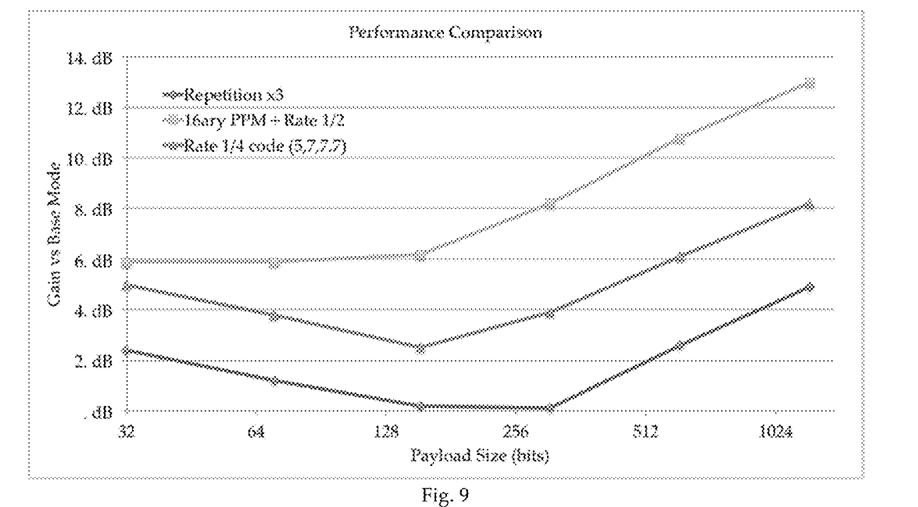
FIG. 9 illustrates a performance comparison of gain vs. packet size (bits) for the pulse position transmitter illustrated in FIG. 7.
Figure 10:
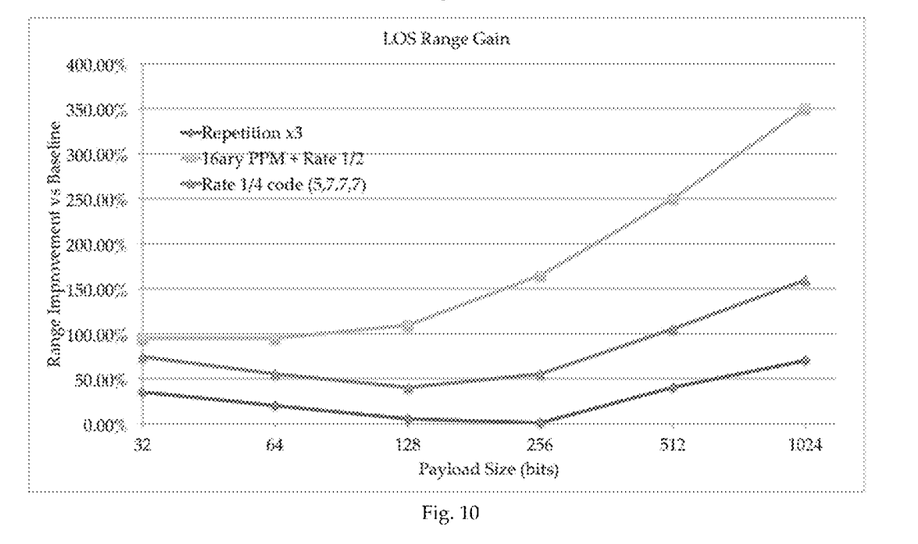
FIG. 10 illustrates line-of-sight ("LOS") range improvement vs. packet size (bits) for the pulse position transmitter illustrated in FIG. 7.

In the illustrated embodiment, at 1 MHz PRF, every 16 µs, the pulse position circuit outputs a single 1 µs wide pulse after the count programmed by $L_1 \ldots L_4$, and each pulse represents 4 coded bits or 2 data bits. The effective bit rate is, therefore, 125 kbps. Similarly a 3 MHz PRF would give an effective bit rate of 375 kbps, and each pulse would still be at max power. FIG. 8 illustrates pulse power vs. peak limited maximum as a function of payload size (bits). FIG. 9 compares performance vs. base mode operation, wherein we have assumed coherent demodulation, but non-coherent demodulation will have similar gain compared to base mode because pulses are at maximum power. FIG. 10 illustrates gain translated into range increase; note that range improvement is two-fold for small packets and almost five-fold for the longest packets. Other advantages include:
1. There is always one pulse for every two input data bits. Base mode has an average of one pulse per two data bits. Further, base mode has a worst case of two pulses per two data bits.
2. Guarantees a pulse in each 16 pulse slot, which greatly improves timing recovery.
3. Pulses are always at max power, so a non-coherent receiver can detect them after the normal squaring operation.

One approach for decoding a PPM-encoded bit stream is to have the receiver measure the distance from the actual receive signal to each of the possible transmit signals, and then use a Viterbi decoder to minimize the path metrics. In this approach, the Viterbi decoder finds the symbol in the past in the path with the minimum path metric. Equivalently, we can measure the correlation of actual received signal to each of the possible transmit signals, and maximize rather than minimize.

Another approach would be to have the receiver perform 16 measurements, $m_0$ to $m_{15}$. The 16 measurements represent two symbols, as shown in the following table:

| first symbol | second symbol | measurement |
|---|---|---|
| 00 | 00 | $m_0$ |
| 00 | 01 | $m_1$ |
| 00 | 10 | $m_2$ |
| 00 | 11 | $m_3$ |
| 01 | 00 | $m_4$ |
| 01 | 01 | $m_5$ |
| 01 | 10 | $m_6$ |
| 01 | 11 | $m_7$ |
| 10 | 00 | $m_8$ |
| 10 | 01 | $m_9$ |
| 10 | 10 | $m_{10}$ |
| 10 | 11 | $m_{11}$ |
| 11 | 00 | $m_{12}$ |
| 11 | 01 | $m_{13}$ |
| 11 | 10 | $m_{14}$ |
| 11 | 11 | $m_{15}$ |

In such an embodiment, a rate 1/2 Viterbi soft decoder expects 4 inputs for each symbol, i.e., one for each of the possible coded bit combinations.

Yet another approach would be to rearrange the 16 measurements as shown in the following table:

|  |  | Second Symbol | | | |
|---|---|---|---|---|---|
|  |  | 00 | 01 | 10 | 11 |
| First Symbol | 00 | $m_0$ | $m_1$ | $m_2$ | $m_3$ |
|  | 01 | $m_4$ | $m_5$ | $m_6$ | $m_7$ |
|  | 10 | $m_8$ | $m_9$ | $m_{10}$ | $m_{11}$ |
|  | 11 | $m_{12}$ | $m_{13}$ | $m_{14}$ | $m_{15}$ |

Looking at row 00 it can be seen that measurements $m_0$, $m_1$, $m_2$ and $m_3$ are all associated with the first symbol being 00. Similarly, looking at the 01 column, it can be seen that measurements $m_1$, $m_5$, $m_9$ and $m_{13}$ are all associated with the second symbol being 01. For the 4 measurements associated with the first symbol, the receiver should put the "best" metric from each row into the Viterbi decoder input associated with that row. Similarly, for the second symbol, the receiver should put the best metric from each column into the Viterbi decoder input associated with that column. If the measurements are distance, the minimum distance is the best metric. For correlations, the highest correlation is the best. Other operations on the rows and columns are also possible inputs to the Viterbi decoder, e.g., instead of the minimum metric, the sum of the metrics could be used. In general, we can use either a conventional soft decision or hard decision Viterbi decoder. Alternatively, we could threshold qualify each pulse and then vote on the outcome, as illustrated in FIG. 3.

Figure 11:
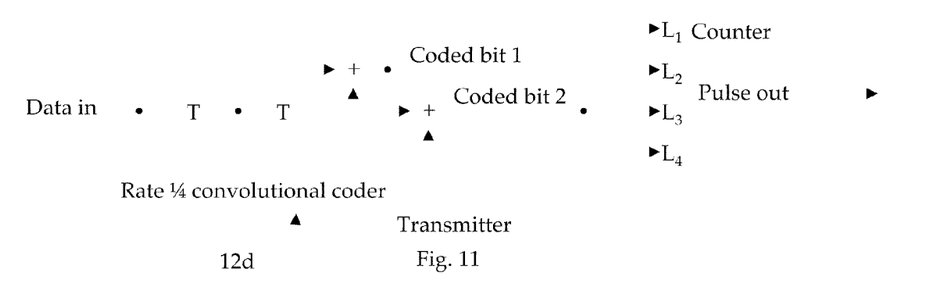
FIG. 11 illustrates, in block diagram form, a pulse position transmitter portion of a communication system, constructed in accordance with still another embodiment of our invention.

Shown in FIG. 11 is a transmitter 12d constructed in accordance with still another alternate embodiment of our invention. In this embodiment, we encode data using a standard, rate 1/4 convolutional code. We then gather together 4 bits of coded data. However, instead of sending these bits as 4 pulses, we send them as just one pulse in one of the next 16 possible pulse positions, i.e., we use 16-ary PPM. For a constraint length 3, $d_{free}$=6 and asymptotic Gain=7.8 dB; actual gain=5.8 dB at $10^{-4}$ BER. We note, however, that the data rate for this embodiment is only half the rate of the 1/2 convolution coder.

Figure 12:
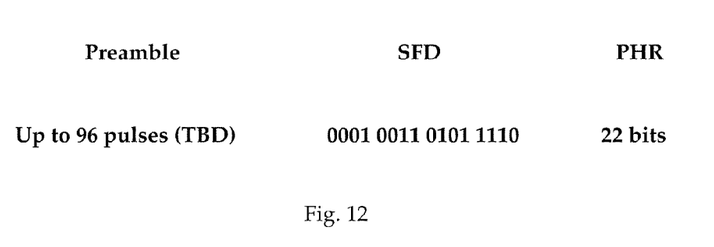
FIG. 12 illustrates extended mode PHY fields, as described, for example, in 802.15.4f.
Figure 13:
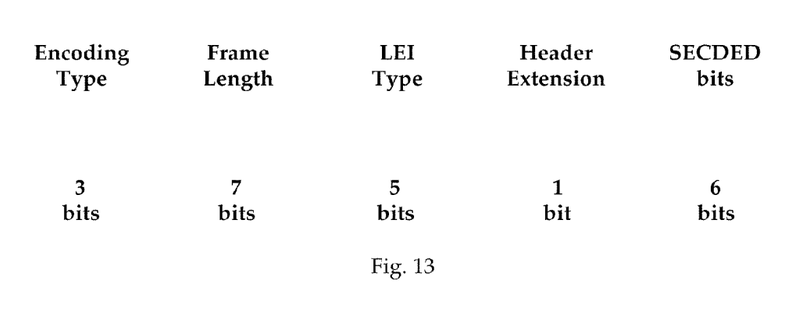
FIG. 13 illustrates a proposed form of PHY header ("PHR") (see, e.g., FIG. 12).

In FIG. 12 we propose extended mode PHY fields compatible with our invention. (Note that the exact number of preamble pulses is to be determined.) We propose that the system operate at a 1 MHz PRF. We submit that the SFD, at 1 pulse per symbol, is very robust. We further propose that the first 3 bits of the PHR are at 1 pulse per symbol (see, FIG. 13); whereas the rest of the PHR is coded as for data. The balance of the packet is coded with pulse remapping and a rate 1/2 convolutional code.

Thus it is apparent that we have provided an improved method and apparatus for transmitting and receiving convolutional code for use in a communication system. For example, the communication system may operate as described in 802.15.4f. In particular, we submit that our method and apparatus provides performance generally comparable to the best prior art techniques while requiring less circuitry and consuming less power than known implementations of such prior art techniques. Therefore, we intend that our invention encompass all such variations and modifications as fall within the scope of the appended claims.

What we claim is:

1. A communication system comprising:
   a transmitter adapted to receive an input bit, and in response thereto, generate at least an n-bit codeword, where n is a first predetermined number, each bit of which is generated by a respective one of n generators of which m are exactly the same, where m is a second predetermined number greater than n/2; and
   a receiver comprising:
      m detectors, each adapted to:
         receive said bit generated by a respective one of said m generators; and
         provide a respective one of m partial detection signals if a strength of said received bit exceeds a predetermined minimum threshold; and
      a majority logic element adapted to:
         receive each of said m partial detection signals; and;
         provide an output bit indicative of said input bit only if more than m/2 of said received m partial detection signals exceeds said minimum threshold.

2. The communication system of claim 1 wherein the codeword comprises a convolutional code with less than optimal free distance, $d_{free}$.

3. The communication system of claim 2 wherein the convolutional code is generated by octal code generators 5,7,7,7.

4. The communication system of claim 1 wherein the receiver further comprises:
   a Viterbi decoder adapted to:
      receive a plurality of said output bits; and
      generate a corresponding plurality of decoded output bits.

5. In a communication system wherein a transmitter receives an input bit and, in response thereto, generates at least an n-bit codeword, where n is a first predetermined number, each bit of which is generated by a respective one of n generators of which m are exactly the same, where m is a second predetermined number greater than n/2, a receiver comprising:
   m detectors, each adapted to:
      receive said bit generated by a respective one of said m generators; and
      provide a respective one of m partial detection signals if a strength of said received bit exceeds a predetermined minimum threshold; and
   a majority logic element adapted to:
      receive each of said m partial detection signals; and;
      provide an output bit indicative of said input bit only if more than m/2 of said received m partial detection signals exceeds said minimum threshold.

6. The communication system of claim 5 wherein the codeword comprises a convolutional code with less than optimal free distance, $d_{free}$.

7. The communication system of claim 6 wherein the convolutional code is generated by octal code generators 5,7,7,7.

8. The communication system of claim 5 wherein the receiver further comprises:
   a Viterbi decoder adapted to:
      receive a plurality of said output bits; and
      generate a corresponding plurality of decoded output bits.

9. The method of claim 1 wherein n is 4 and m is 3.

10. The method of claim 5 wherein n is 4 and m is 3.

11. In a communication system comprising a transmitter and a receiver, a method comprising the steps of:
    in the transmitter:
       receiving an input bit, and in response thereto, generating at least an n-bit codeword, where n is a first predetermined number, each bit of which is generated by a respective one of n generators of which m are exactly the same, where m is a second predetermined number greater than n/2; and
    in the receiver:
       in each of m detectors:
          receiving said bit generated by a respective one of said m generators; and
          providing a respective one of m partial detection signals if a strength of said received bit exceeds a predetermined minimum threshold; and
       in a majority logic element:
          receiving each of said m partial detection signals; and
          providing an output bit indicative of said input bit only if more than m/2 of said received m partial detection signals exceeds said minimum threshold.

12. The method of claim 11 wherein the codeword comprises a convolutional code with less than optimal free distance, $d_{free}$.

13. The method of claim 12 wherein the convolutional code is generated by octal code generators 5,7,7,7.

14. The method of claim 11 further comprising the steps of:
    in a Viterbi decoder:
       receiving a plurality of said output bits; and
       generating a corresponding plurality of decoded output bits.

15. The method of claim 11 wherein n is 4 and m is 3.

* * * * *

UNITED STATES PATENT AND TRADEMARK OFFICE
CERTIFICATE OF CORRECTION

PATENT NO.         : 8,677,224 B2                               Page 1 of 6
APPLICATION NO.    : 13/092146
DATED              : March 18, 2014
INVENTOR(S)        : Michael McLaughlin et al.

It is certified that error appears in the above-identified patent and that said Letters Patent is hereby corrected as shown below:

On the Title page

Delete the title page and substitute the attached title page therefor.

In the Drawings

Pages 1, 2, 3 and 5 of the drawings are replaced with the attached pages 1, 2, 3, and 5, respectively.

Signed and Sealed this
Twenty-fourth Day of June, 2014

Michelle K. Lee
*Deputy Director of the United States Patent and Trademark Office*

(12) United States Patent
McLaughlin et al.

(10) Patent No.: US 8,677,224 B2
(45) Date of Patent: Mar. 18, 2014

(54) CONVOLUTIONAL CODE FOR USE IN A COMMUNICATION SYSTEM

(75) Inventors: Michael McLaughlin, Dublin (IE); Billy Verso, Maynooth (IE)

(73) Assignee: DecaWave Ltd., Dublin (IE)

(*) Notice: Subject to any disclaimer, the term of this patent is extended or adjusted under 35 U.S.C. 154(b) by 137 days.

(21) Appl. No.: 13/092,146

(22) Filed: Apr. 21, 2011

(65) Prior Publication Data
US 2011/0264988 A1 Oct. 27, 2011

Related U.S. Application Data

(60) Provisional application No. 61/332,126, filed on May 6, 2010, provisional application No. 61/327,769, filed on Apr. 26, 2010, provisional application No. 61/326,282, filed on Apr. 21, 2010.

(51) Int. Cl.
*H03M 13/03* (2006.01)

(52) U.S. Cl.
USPC .......................................................... 714/786

(58) Field of Classification Search
None
See application file for complete search history.

(56) References Cited

U.S. PATENT DOCUMENTS

| | | | | |
|---|---|---|---|---|
| 3,891,959 | A * | 6/1975 | Tsuji et al. | 714/786 |
| 4,404,674 | A * | 9/1983 | Rhodes | 714/793 |
| 5,115,438 | A * | 5/1992 | Friederichs et al. | 714/793 |
| 5,499,246 | A * | 3/1996 | Cooper | 370/345 |
| 6,023,783 | A * | 2/2000 | Divsalar et al. | 714/792 |
| 6,415,005 | B2 * | 7/2002 | Koga et al. | 375/347 |
| 2001/0001617 | A1 * | 5/2001 | Koga et al. | 375/347 |
| 2002/0147954 | A1 * | 10/2002 | Shea | 714/755 |
| 2003/0126545 | A1 * | 7/2003 | Tan | 714/786 |
| 2003/0185181 | A1 * | 10/2003 | Balachandran et al. | 370/337 |
| 2004/0072572 | A1 * | 4/2004 | Nakamura et al. | 455/450 |
| 2004/0179517 | A1 * | 9/2004 | Yamamoto et al. | 370/356 |
| 2007/0041458 | A1 * | 2/2007 | Hocevar et al. | 375/260 |

\* cited by examiner

*Primary Examiner* — Guerrier Merant
(74) *Attorney, Agent, or Firm* — Jeffrey Van Myers; Artie A. Pennington (57) ABSTRACT

In a communication system, a transmitter receives an input bit, and in response thereto, generates at least an n-bit codeword, each bit of which is generated by a respective one of n generators of which m are exactly the same, m being greater than n/2. A receiver comprises: m detectors, each adapted to receive the bit generated by a respective one of the m generators, and provide a respective one of m partial detection signals if a strength of the received bit exceeds a predetermined minimum threshold; and a majority logic element adapted to receive each of the m partial detection signals, and provide an output bit indicative of the input bit only if more than m/2 of the received m partial detection signals exceeds the minimum threshold.

15 Claims, 5 Drawing Sheets

Rate ½ convolutional coder

12c

Transmitter

Fig. 7

Fig. 8

Rate ¼ convolutional coder

12d

Transmitter
Fig. 11

Fig. 12

Fig. 13